United States Patent
Moriyama et al.

(10) Patent No.: US 6,975,012 B2
(45) Date of Patent: Dec. 13, 2005

(54) SEMICONDUCTOR RADIATION DETECTOR HAVING VOLTAGE APPLICATION MEANS COMPRISES $In_xCd_yTe_z$ ON CDTE SEMICONDUCTOR SUBSTRATE

(75) Inventors: Miki Moriyama, Kyoto (JP); Masaki Murakami, Kyoto (JP); Atsushi Kyan, Gushikawa (JP); Ryoichi Ohno, Gushikawa (JP)

(73) Assignee: Acrorad Co., Ltd., Okinawa (JP)

( * ) Notice: Subject to any disclaimer, the term of this patent is extended or adjusted under 35 U.S.C. 154(b) by 0 days.

(21) Appl. No.: 10/697,129

(22) Filed: Oct. 29, 2003

(65) Prior Publication Data

US 2004/0129994 A1 Jul. 8, 2004

Related U.S. Application Data

(63) Continuation of application No. PCT/JP02/03615, filed on Apr. 11, 2002.

(30) Foreign Application Priority Data

May 15, 2001 (JP) .......................... 2001-144313

(51) Int. Cl.$^7$ ...................... H01L 31/07; H01L 31/105; H01L 31/117
(52) U.S. Cl. ...................... 257/442; 257/449; 257/458; 257/614
(58) Field of Search ................................ 257/428, 442, 257/449, 458, 614, 431, 461; 250/370.2, 370.13, 370.14

(56) References Cited

U.S. PATENT DOCUMENTS 4,132,999 A * 1/1979 Maille et al. ............... 257/183
4,190,486 A * 2/1980 Kyle ........................... 438/502
5,391,882 A * 2/1995 Rhiger .................. 250/370.13
5,510,644 A * 4/1996 Harris et al. .......... 250/370.13
6,011,264 A * 1/2000 Lachish et al. ........ 250/370.13
6,114,738 A * 9/2000 Tregilgas et al. ........... 257/442
2004/0026758 A1 * 2/2004 Kuroda et al. .............. 257/443

FOREIGN PATENT DOCUMENTS

| JP | 56-30771 A | 3/1981 |
|---|---|---|
| JP | 62-115391 A | 5/1987 |
| JP | 3-248578 A | 6/1991 |
| JP | 7-221340 A | 8/1995 |
| WO | WO 86/00940 A | 2/1986 |

OTHER PUBLICATIONS

Matsumoto et al., "Performance of a new Schottky CdTe detector for hard X–ray spectroscopy", Nuclear Science Symposium, 1997, IEEE, pp. 569 to 573, vol. 11.

* cited by examiner

*Primary Examiner*—Anh Duy Mai
(74) *Attorney, Agent, or Firm*—Cohen, Pontani, Lieberman & Pavane

(57) ABSTRACT

Disclosed is a semiconductor radiation detector element of Schottky barrier type, comprising: a compound semiconductor crystal including cadmium and tellurium as main components; and voltage application means for applying voltage to the compound semiconductor crystal. According to the present invention, said voltage application means includes a compound of indium, cadmium and tellurium: $In_xCd_yTe_z$ formed on one surface of the compound semiconductor crystal. Preferably, the rate "z" of occupation of tellurium in the compound $In_xCd_yTe_z$ is in the range of not less than 42.9%, but not greater than 50% by ratio of number of atoms. Furthermore, preferably, the rate "y" of occupation of cadmium in the compound $In_xCd_yTe_z$ is in the range of not less than 0%, but not greater than 10% by ratio of number of atoms.

2 Claims, 4 Drawing Sheets

$In_xCd_yTe_z$ LAYER
CdTe CRYSTAL
Pt LAYER

SEMICONDUCTOR RADIATION DETECTOR HAVING VOLTAGE APPLICATION MEANS COMPRISES $In_xCd_yTe_z$ ON CDTE SEMICONDUCTOR SUBSTRATE

This application is a U.S. Continuation Application under 35 USC 371 of International Application PCT/JP02/03615 filed 11 Apr. 2002.

FIELD OF THE INVENTION

The present invention relates to a compound semiconductor radiation detector element for use in the fields of nuclear medicine, radiation diagnosis, atomic power, astronomy, cosmic ray physics, etc.

BACKGROUND OF THE INVENTION

In general, a semiconductor radiation detector element is a device in which an electric charge produced therein due to ionization effect of incident radiation is swept and collected to produce a signal under an electric field applied between both electrodes. Therefore, it is very important to collect the electric charge with higher efficiency to attain higher resolution for energy relative to the incident radiation.

In order to get such higher efficiency for collection of the charge it is preferable that the distance "l" for migration of charge carriers (electron and hole) is longer, or in other words, the strength of electric field is stronger. The distance "l" for migration of charge carriers is defined as follows:

$$l = \mu \tau E$$

where $\mu$ is mobility of an electric charge; $\tau$ is life of a carrier; and E is strength of an electric field.

On the other hand, all the semiconductor radiation detector elements have such tendency that some leakage current constantly flows according to the voltage applied even if there is no incident radiation present, which is one of the causes that lowers the resolution for energy. As the result, the voltage that may be applied across both electrodes is limited.

A "P" type CdTe crystal for a radiation detector element has electric specific resistance in the order of $\sim 10^9$ $\Omega$cm. The crystal has been used to fabricate a semiconductor radiation detector element of MSM (metal electrode—semiconductor—metal electrode) type in such manner that ohmic electrodes are formed on opposite surfaces of the crystal. However, such device is defective in that it has insufficient capability of suppression of leakage current if sufficient bias voltage is applied to get good collection of the charge. Inversely, if reduced bias voltage is applied to decrease the leakage current, collection of the charge becomes insufficient. Therefore, no satisfactory resolution for energy can be attained in the device of MSM type.

In order to overcome the deficiency of CdTe semiconductor radiation detector element of MSM type, as described above, a semiconductor radiation detector element of Schottky barrier type has been proposed in which an electrode of indium, etc. is provided on one surface of "P" type CdTe crystal to form a Schottky contact therebetween and an electrode of gold, platinum, etc. is provided on opposite surface of the crystal to form an ohmic contact therebetween.

The semiconductor radiation detector element of Schottky barrier type, as described above, has been found to provide good rectifying characteristic so that leakage current, if any, can be suppressed to the minimum even in the presence of higher electric field by applying some reversed voltage, thereby providing good resolution for energy.

In the CdTe semiconductor radiation detector element having metal material, e.g. indium, as the electrode at the side of Schottky barrier, however, such phenomenon has been observed that the efficiency of charge collection becomes significantly reduced with the time after application of bias voltage. This phenomenon is referred to as "Polarization Effect". The phenomenon has been considered to be caused due to the fact that because of incomplete of Schottky contact at positive side and ohmic contact at negative side there is any distortion present in band structure, and accordingly, a hole is restrained in a filled band to form an electron trapping center before the hole reaches the negative pole. That is to say, in the CdTe semiconductor radiation detector element of Schottky barrier type having indium used as the electrode, good resolution for energy is provided immediately after application of the voltage, but it lowers with the progress of time, which has imposed significant problem for actual usage.

In view of the above, it is an object of the present invention to solve the problems for prior art electrode configuration, as described above, and to provide an improved radiation detector element of Schottky barrier type that is unlikely to have "Polarization Effect" by incorporation of improved electrode configuration.

SUMMARY OF THE INVENTION

To attain such object the present invention provide a semiconductor radiation detector element of Schottky barrier type, comprising: a compound semiconductor crystal including cadmium and tellurium as the main components; and voltage application means for applying voltage to the compound semiconductor crystal, said voltage application means including a compound of indium, cadmium and tellurium: $In_xCd_yTe_z$ formed on one surface of the compound semiconductor crystal.

The rate "z" of occupation of tellurium in the compound $In_xCd_yTe_z$ is selected to be within the range of not less than 42.9%, but not greater than 50% by ratio of number of atoms. Furthermore, the rate "y" of occupation of cadmium is selected to be within the range of not less than 0%, but not greater than 10% by ratio of number of atoms.

The present invention provides an advantageous effect in that a Schottky barrier junction is formed between the CdTe compound semiconductor and the compound layer $In_xCd_yTe_z$ to provide good rectifying characteristic. In other words, when applying the voltage in such direction that higher potential is produced at the side of $In_xCd_yTe_z$, higher efficiency for charge collection can be attained while advantageously suppressing any leakage current. As the result, the radiation detection element having good resolution for energy can be provided.

In this respect, if the rate "z" of occupation of tellurium in the compound $In_xCd_yTe_z$ is selected to be within the range of not less than 42.9%, but not greater than 50% by ratio of number of atoms, and the rate "y" of occupation of cadmium is selected to be within the range of not less than 0%, but not greater than 10% by ratio of number of atoms, then the efficiency for charge collection can be kept at higher level that is attained immediately after application of the bias voltage for longer period of time even at normal temperature to provide stable operation that is unlikely to have "Polarization Effect". In contrast thereto, the rate "z" of occupation of tellurium in the compound $In_xCd_yTe_z$ within the range of less than 42.9% or greater than 50% by ratio of number of atoms, or the rate "y" of occupation of cadmium within the range of greater than 10% by ratio of number of atoms is not suitable because of reduction in efficiency for charge collection observed shortly after application of the bias voltage.

Accordingly, the semiconductor radiation detector element of the present invention provides stable operation for period of several hours in normal temperature, as compared to the prior art radiation detection element of Schottky barrier type wherein phenomenon in which efficiency for charge collection reduces with the time, also known as "Polarization Effect", starts shortly (or several minutes to several tens minutes) after application of bias voltage.

BRIEF DESCRIPTION OF THE DRAWINGS

The present invention will now be described in detail with reference to the accompanying drawings, in which.

DESCRIPTION OF THE PREFERRED EMBODIMENT

Now, an embodiment of the present invention will be described with reference to the accompanying drawings.

A CdTe semiconductor crystal wafer is provided with an $In_xCd_yTe_z$ thin film on one surface thereof by any film fabrication technique such as sputtering and with an ohmic electrode of platinum on the opposite surface thereof. In this respect, a Schottky junction is formed between the CdTe crystal and the $In_xCd_yTe_z$ thin film. An additional thin metal film of aluminum, for example, may be deposited on the surface of $In_xCd_yTe_z$ layer for use as the contact. It is noted that the fabrication method for the $In_xCd_yTe_z$ thin film is not limited to the sputtering.

The semiconductor crystal is not limited to the CdTe semiconductor crystal, as described above, but it may be replaced with another compound semiconductor crystal including cadmium and tellurium as the main components in which the rate of occupation of cadmium is selected to be within the range of not less than 30%, but not greater than 50% by ratio of number of atoms. One example of such compound is cadmium zinc tellurium ($Cd_{1-x}Z_xTe$).

After fabrication of the electrode the wafer is cut into chips having suitable size by dicing process.

Embodiment 1:

Method of fabrication of a semiconductor radiation detector element of Schottky barrier type, comprising a compound semiconductor crystal including cadmium and tellurium as the main components and voltage application means for applying voltage to the compound semiconductor crystal, said voltage application means including a compound of indium, cadmium and tellurium: $In_xCd_yTe_z$ formed on one surface of the compound semiconductor crystal will be described hereafter. In addition, measurement of radiation energy spectrum using the semiconductor radiation detector element will also be described.

Figure 1:
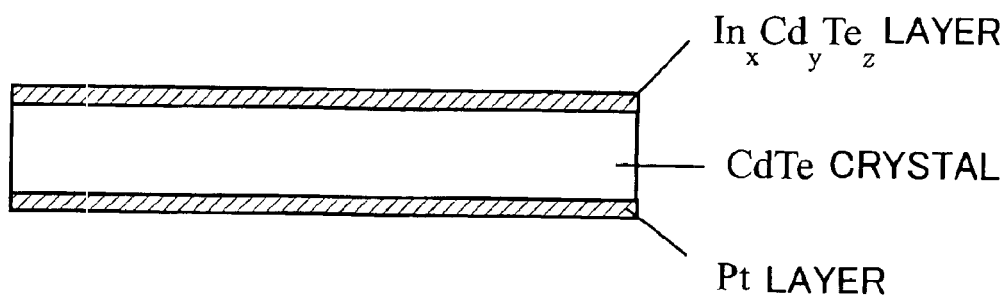
FIG. 1 is a view of an electrode configuration of a radiation detector element according to the present invention.
Figure 2:
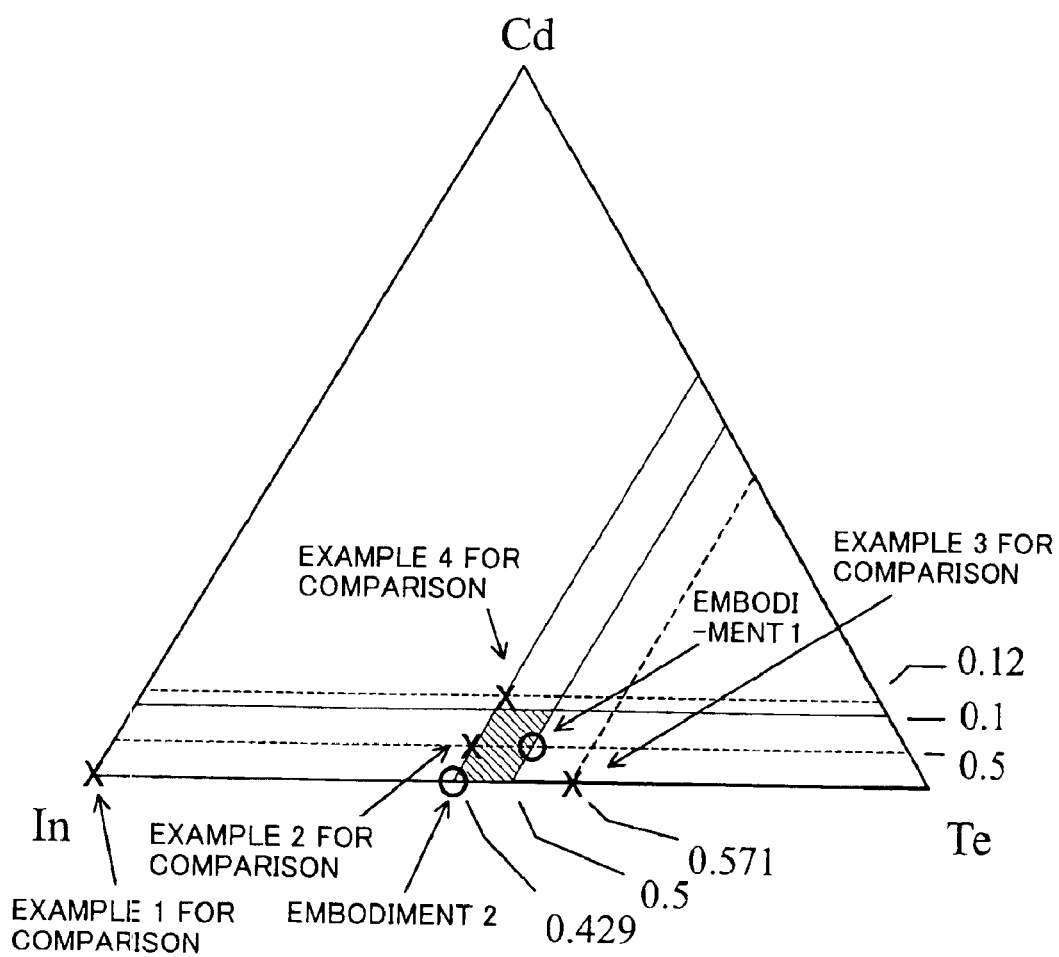
FIG. 2 is a view illustrating the rate of occupation of each component in compound $In_xCd_yTe_z$ in each of embodiments and examples for comparison.

A "P" type CdTe semiconductor crystal wafer having specific resistance of $10^9$ Ωcm was provided with, on one surface thereof, a layer of compound of indium, cadmium and tellurium: $In_xCd_yTe_z$, as an electrode for forming Schottkey barrier, by sputtering. The semiconductor crystal wafer was provided with, on the opposite surface thereof, an ohmic electrode of platinum by electroless plating (see FIG. 1). Composition of the $In_xCd_yTe_z$ layer was analyzed by X-ray diffraction method (XRD) and energy distributed X-ray analysis device (EDX). As the result, the composition was determined as $In_{49.5}Cd_{0.5}Te_{50}$ (see FIG. 2). Thereafter, the wafer with electrodes was cut into chips having suitable size to produce a semiconductor radiation detector element of Schottky barrier.

Figure 3:
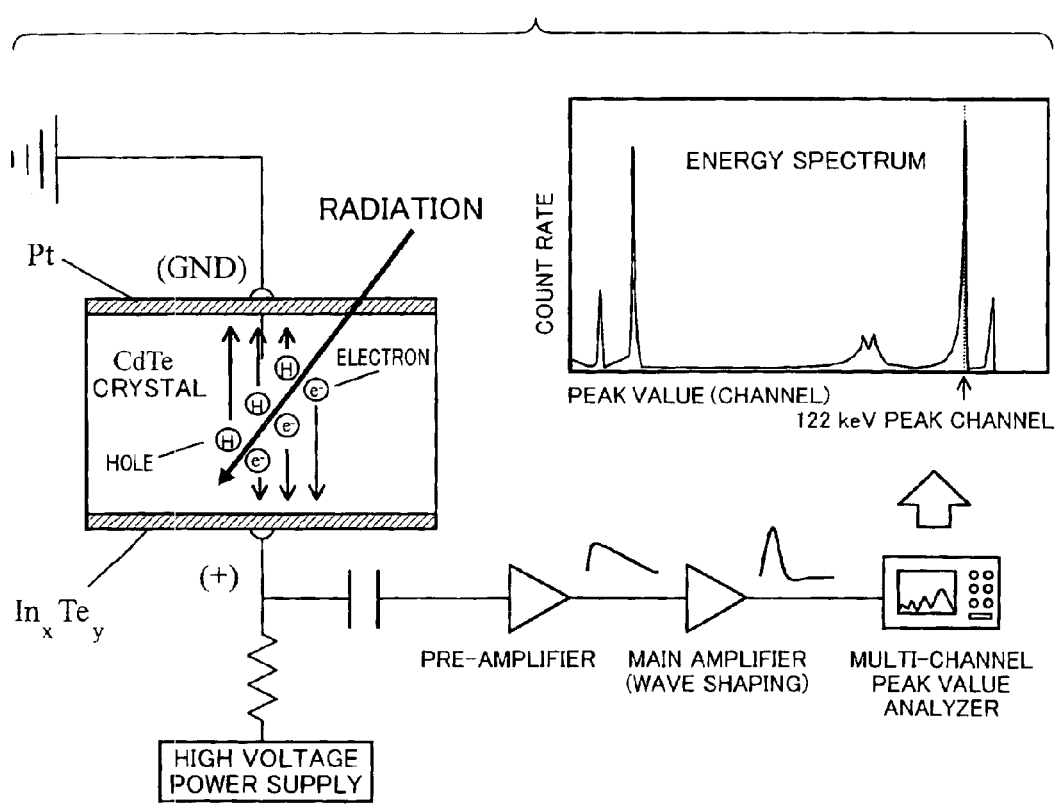
FIG. 3 is a view schematically illustrating spectrum measurement operation using the radiation detector element according to one embodiment of the present invention.

FIG. 3 schematically illustrates spectrum measurement operation using the radiation detector element. As shown, the platinum electrode (negative pole) is grounded and the $In_xCd_yTe_z$ electrode (positive pole) is connected to a high voltage power supply and to a pre-amplifier.

Figure 4:
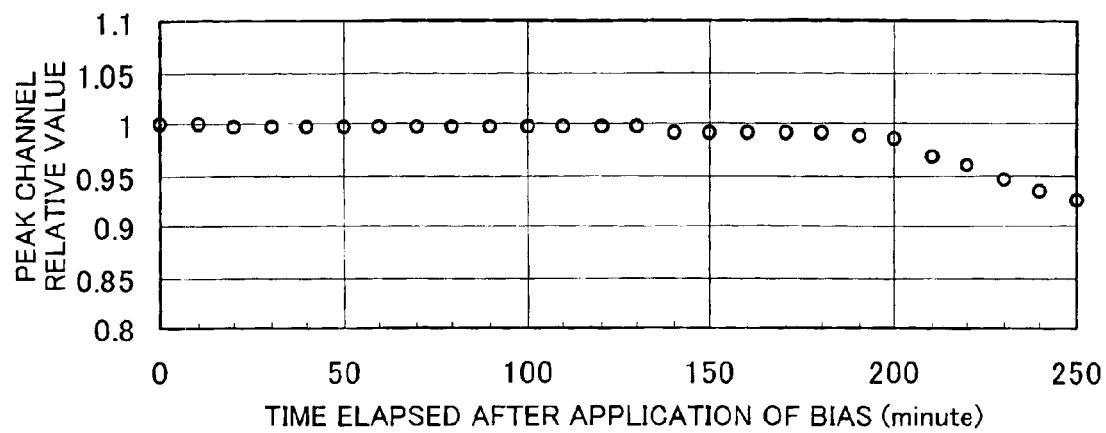
FIG. 4 is a graph illustrating change in response to monochromatic radiation with the time, as measured in the radiation detector element of the present invention.

FIG. 4 is a graph illustrating change in response to radiation energy spectrum from $^{57}Co$ gamma radiation source with the time. In this respect, reduction in performance of the detector element was evaluated by observing any change in peak channel response to 122 keV photoelectric absorption peak especially among photon energy emitted from the $^{57}Co$ gamma radiation source with the time. As is apparent in the graph, the CdTe radiation detector element of Schottky barrier type according to the present invention exhibited the constant response to the 122 keV photoelectric absorption event for period of 180 minutes after application of bias voltage. In other words, the radiation detector element of Schottky barrier type according to the present invention provided stable operation for longer period of time at room temperature. It is noted that "Peak Channel Relative Value" at the ordinate in the graph of FIG. 4 was derived from such assumption that the value resulted immediately (or zero minute) after application of bias voltage is 1.

Embodiment 2:

A "P" type CdTe semiconductor crystal wafer having specific resistance of $10^9$ Ωcm was provided with, on one surface thereof, a layer of compound of indium, cadmium and tellurium: $In_xCd_yTe_z$, as an electrode for forming Schottkey barrier, by resistance heating vapor deposition. The semiconductor crystal wafer was provided with, on the opposite surface thereof, an ohmic electrode of platinum by electroless plating (see FIG. 1). Composition of the $In_xCd_yTe_z$ layer was analyzed by X-ray diffraction method (XRD) and energy distributed X-ray analysis device (EDX). As the result, the composition was determined as $In_{57.1}Cd_0Te_{42.9}$ ($In_4Te_3$) (see FIG. 2). Thereafter, the CdTe radiation detector element of Schottky barrier type was used to form a spectrometer as in the case of Embodiment 1 and the response of the detector element to monochromatic radiation was observed. As the result, the radiation detector element of Embodiment 2 exhibited higher efficiency for charge collection and stable operation for longer period of time as in the case of Embodiment 1.

Embodiment 3:

A "P" type CdTe semiconductor crystal wafer having specific resistance of $10^9$ Ωcm was provided with, on one surface thereof, a layer of compound of indium, cadmium and tellurium: $In_xCd_yTe_z$, as an electrode for forming Schottky barrier, by resistance heating vapor deposition. The semiconductor crystal wafer was provided with, on the opposite surface thereof, an ohmic electrode of platinum by electroless plating (see FIG. 1). Composition of the $In_x$-$Cd_yTe_z$ layer was analyzed by X-ray diffraction method (XRD) and energy distributed X-ray analysis device (EDX). As the result, the composition was determined as $In_{56.6}Cd_{0.5}Te_{42.9}$ (see FIG. 2). Thereafter, the CdTe radiation detector element of Schottky barrier type was used to conduct spectrum measurement as in the case of Embodiment 1 and the response of the detector element to monochromatic radiation was observed. As the result, the radiation detector element of Embodiment 3 exhibited higher efficiency for charge collection and stable operation for longer period of time as in the case of Embodiment 1.

EXAMPLE 1 FOR COMPARISON

Figure 5:
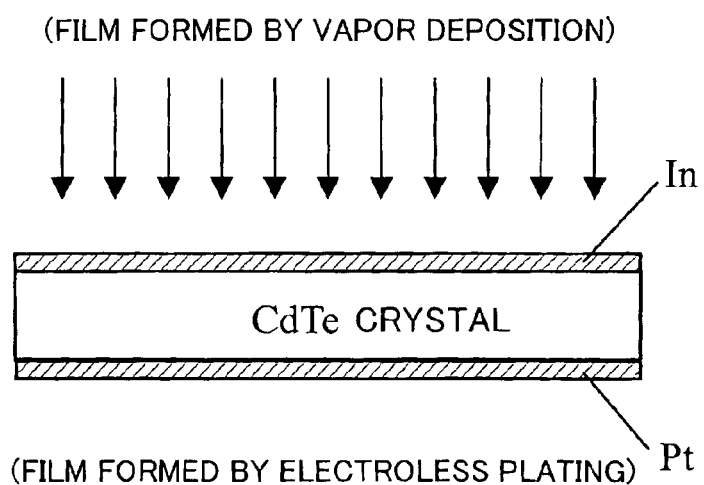
FIG. 5 is a view illustrating an electrode configuration and electrode fabrication process for a conventional radiation detector element, illustrated for the purpose of comparison.
Figure 6:
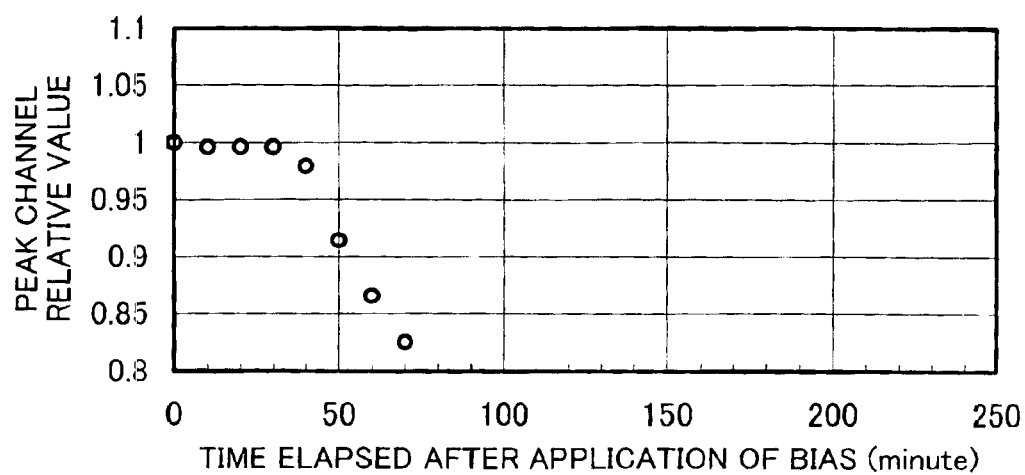
FIG. 6 is a graph illustrating change in response to monochromatic radiation with the time, as measured in the conventional radiation detector element.

A CdTe semiconductor crystal wafer was provided with an indium layer on one surface thereof by sputtering, and it was provided with a platinum electrode on the opposite surface thereof (see FIG. 5). Composition of the indium layer was analyzed by X-ray diffraction method (XRD) and energy distributed X-ray analysis device (EDX). As the result, the layer was found to purely have indium ($In_{100}Cd_0Te_0$) (see FIG. 2). The radiation detector element fabricated in such manner exhibited Schottky characteristic, could be applied higher electric field, and provided higher efficiency of charge collection, as in the case of the embodiments as described above. However, the CdTe semiconductor radiation detector element rapidly lowered in performance with the time, as shown in FIG. 6. More specifically, the photoelectric absorption peak channel response to 122 keV photon emitted from $^{57}Co$ gamma radiation source started to reduce only approx. 20 to 30 minutes after application of bias voltage, and then, lowered down to the value corresponding to approx. 90% of the initial value 50 minutes after application of bias voltage. Accordingly, the semiconductor radiation detector element in Example 1 provided no stable operation for certain time period. It is noted that "Peak Channel Relative Value" at the ordinate in the graph of FIG. 6 was derived from such assumption that the value resulted immediately (or zero minute) after application of bias voltage is 1.

EXAMPLE 2 FOR COMPARISON

A CdTe semiconductor crystal wafer was provided with a layer of compound of indium, cadmium and tellurium, of which rate of occupation is represented by $In_{57.1}Cd_{0.5}Te_{42.4}$, on one surface thereof by sputtering (see FIG. 2), and it was provided with a platinum electrode on the opposite surface thereof. The radiation detector element fabricated in such manner exhibited Schottky characteristic, could be applied higher electric field, and provided higher efficiency of charge collection, as in the case of the embodiments, as described above. However, the semiconductor radiation detector element rapidly lowered in performance with the time and provided no stable operation for certain time period, as in the case of Example 1.

EXAMPLE 3 FOR COMPARISON

A CdTe semiconductor crystal wafer was provided with a layer of compound of indium, cadmium and tellurium, of which rate of occupation is represented by $In_{42.9}Cd_0Te_{57.1}$ (or $In_3Te_4$), on one surface thereof by sputtering (see FIG. 2), and it was provided with a platinum electrode on the opposite surface thereof. The radiation detector element fabricated in such manner exhibited Schottky characteristic, could be applied higher electric field, and provided higher efficiency of charge collection, as in the case of the embodiments, as described above. However, the semiconductor radiation detector element rapidly lowered in performance with the time and provided no stable operation for certain time period, as in the case of Example 1.

EXAMPLE 4 FOR COMPARISON

A CdTe semiconductor crystal wafer was provided with a layer of compound of indium, cadmium and tellurium, of which rate of occupation is represented by $In_{45.1}Cd_{12}Te_{42.9}$, on one surface thereof by sputtering (see FIG. 2), and it was provided with a platinum electrode on the opposite surface thereof. The radiation detector element fabricated in such manner exhibited Schottky characteristic, could be applied higher electric field, and provided higher efficiency of charge collection, as in the case of the embodiments, as described above. However, the semiconductor radiation detector element rapidly lowered in performance with the time and provided no stable operation for certain time period, as in the case of Example 1.

What is claimed is:

1. A semiconductor radiation detector element of a Schottky type barrier, comprising:

a compound semiconductor crystal including cadmium and tellurium as main components; and voltage application means for applying voltage to the compound semiconductor crystal, said voltage application means including a compound of indium, cadmium and tellurium: $In_xCd_yTe_z$ formed on one surface of the compound semiconductor crystal;

wherein the rate "z" of occupation of tellurium in the compound of indium, cadmium and tellurium: $In_x$-$Cd_yTe_z$ is within a range of not less than 42.9%, but not greater than 50% by ratio of number of atoms.

2. A semiconductor radiation detector element of a Schottky type barrier, comprising:

a compound semiconductor crystal including cadmium and tellurium as main components; and voltage application means for applying voltage to the compound semiconductor crystal, said voltage application means including a compound of indium, cadmium and tellurium ($In_xCd_yTe_z$) formed on one surface of the compound semiconductor crystal;

voltage application means for applying voltage to the compound semiconductor crystal, said voltage application means including a compound of indium, cadmium and tellurium: $In_xCd_yTe_z$ formed on one surface of the compound semiconductor crystal;

wherein the rate "y" of occupation of cadmium in the compound of indium, cadmium and tellurium: $In_x$-$Cd_yTe_z$ is within a range of not less than 0%, but not greater than 10% by ratio of number of atoms.

* * * * *